(12) United States Patent
Liu

(10) Patent No.: US 12,075,610 B2
(45) Date of Patent: Aug. 27, 2024

(54) SEMICONDUCTOR STRUCTURE MANUFACTURING METHOD AND SEMICONDUCTOR STRUCTURE

(71) Applicant: CHANGXIN MEMORY TECHNOLOGIES, INC., Hefei (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 504 days.

(21) Appl. No.: 17/401,606

(22) Filed: Aug. 13, 2021

(65) Prior Publication Data

US 2022/0157826 A1     May 19, 2022

Related U.S. Application Data

(63) Continuation of application No. PCT/CN2021/095465, filed on May 24, 2021.

(30) Foreign Application Priority Data

Nov. 19, 2020    (CN) .......................... 202011301297.7

(51) Int. Cl.
*H01L 27/108*      (2006.01)
*H01L 21/3065*     (2006.01)
(Continued)

(52) U.S. Cl.
CPC ....... *H10B 12/053* (2023.02); *H01L 21/3065* (2013.01); *H01L 21/308* (2013.01); *H10B 12/34* (2023.02)

(58) Field of Classification Search
CPC ...... H10B 12/053; H10B 12/34; H10B 12/09; H10B 12/488; H01L 21/3065; H01L 21/308; H01L 21/3083
See application file for complete search history.

(56) References Cited

U.S. PATENT DOCUMENTS 6,465,299 B1    10/2002   Son
7,176,512 B2    2/2007    Lee
(Continued)

FOREIGN PATENT DOCUMENTS

CN        103871969 A     6/2014
CN        104769678 A     7/2015
(Continued)

OTHER PUBLICATIONS

Supplementary European Search Report in the European application No. 21773265.0, mailed on Jun. 14, 2022, 9 pgs.
(Continued)

*Primary Examiner* — Mohammed R Alam
(74) *Attorney, Agent, or Firm* — Kilpatrick Townsend & Stockton LLP

(57) ABSTRACT

Provided are a semiconductor structure manufacturing method and a semiconductor structure. The semiconductor structure manufacturing method includes: a substrate is provided, which includes a first area and a second area set adjacent to each other; multiple trenches, which are arranged at intervals along a first direction, are formed in both the first area and the second area of the substrate; a word line (WL) is formed in each of the multiple trenches, a feature size of the WL in the first area is different from that of the WL in the second area; and a contact structure is formed on the WL with the greater feature size.

16 Claims, 9 Drawing Sheets

(51) Int. Cl.
*H01L 21/308* (2006.01)
*H10B 12/00* (2023.01)

(56) References Cited

U.S. PATENT DOCUMENTS

| | | |
|---|---|---|
| 7,375,390 B2 | 5/2008 | Lee |
| 9,177,962 B2 | 11/2015 | Taniguchi |
| 9,218,881 B2 | 12/2015 | Yang et al. |
| 9,269,717 B2 | 2/2016 | Yu |
| 2002/0195680 A1 | 12/2002 | Son |
| 2005/0035387 A1 | 2/2005 | Lee |
| 2007/0108491 A1 | 5/2007 | Lee |
| 2007/0212892 A1 | 9/2007 | Caspary |
| 2009/0170333 A1 | 7/2009 | Sasano |
| 2010/0258858 A1* | 10/2010 | Kim ............... H01L 29/7851 438/270 |
| 2014/0115230 A1* | 4/2014 | Yang ............... G11C 16/349 365/185.01 |
| 2015/0255476 A1 | 9/2015 | Yu |
| 2020/0243537 A1* | 7/2020 | Li ..................... H01G 4/012 |

FOREIGN PATENT DOCUMENTS

| | | |
|---|---|---|
| CN | 106601743 A | 4/2017 |
| CN | 107994018 A | 5/2018 |
| CN | 111640753 A | 9/2020 |
| CN | 111640754 A | 9/2020 |
| CN | 111755423 A | 10/2020 |

OTHER PUBLICATIONS

International Search Report in the international application No. PCT/CN2021/095465, mailed on Aug. 27, 2021, 3 pgs.
Second Office Action of the European application No. 21773265.0, issued on Jul. 31, 2023, 9 pages.
English translation of the Written Opinion of the International Search Authority in the international application No. PCT/CN2021/095465, mailed on Aug. 27, 2021, 3 pages.

* cited by examiner

SEMICONDUCTOR STRUCTURE MANUFACTURING METHOD AND SEMICONDUCTOR STRUCTURE

CROSS-REFERENCE TO RELATED APPLICATIONS

This application is a continuation of International patent application No. PCT/CN2021/095465, filed on May 24, 2021, which is filed based upon and claims priority to Chinese patent application No. 202011301297.7, filed on Nov. 19, 2020. The contents of International patent application No. PCT/CN2021/095465 and Chinese patent application No. 202011301297.7 are incorporated herein by reference in their entireties.

TECHNICAL FIELD

The disclosure relates to the field of semiconductor manufacturing technologies, and in particular to a semiconductor structure manufacturing method and a semiconductor structure.

BACKGROUND

A dynamic random access memory (DRAM) is a semiconductor memory for writing and reading data at high speed and randomly, and is widely used in data storage equipment or devices.

The DRAM includes multiple repeating memory units, each of which usually includes a capacitor and a transistor. A grid electrode of the transistor is connected/coupled to a word line (WL), a drain electrode is coupled to a bit line, and a source electrode is coupled to the capacitor. A voltage signal on the WL could control the transistor to be on or off, and then data information stored in the capacitor is read through the bit line, or the data information is written into the capacitor through the bit line for storage. The WL is coupled to a WL driver through a local interconnect contact (LICON) located in a periphery area of the memory unit, so that it is convenient for the WL driver to input the voltage signal to the WL.

However, as a feature size of a DRAM device continues to decrease, the spacing between adjacent WLs decreases, which increases the difficulty of setting a contact structure and increases the contact resistance; moreover, the problem of circuit break and short circuit occurs easily at the contact structure, which influences the storage performance of the semiconductor memory.

SUMMARY

In a first aspect, the disclosure provides a semiconductor structure manufacturing method, which includes: providing a substrate including a first area and a second area set adjacent to each other; forming multiple trenches, which are arranged at intervals along a first direction, in both the first area and the second area of the substrate; forming a WL in each of the multiple trenches, a feature size of the WL in the first area being different from a feature size of the WL in the second area; and forming a contact structure on the WL with the greater feature size.

In a second aspect, the disclosure provides a semiconductor structure, which includes: a substrate, a WL and a contact structure. The substrate includes a first area and a second area set adjacent to each other. The WL is located in the first area and the second area, and a feature size of the WL in the first area is different from a feature size of the WL in the second area. The contact structure is located on the WL with the greater feature size.

The structure of the disclosure and its other inventive purposes and beneficial effects will be more obvious and understandable through a description of the preferred embodiments in combination with the accompanying drawings.

BRIEF DESCRIPTION OF THE DRAWINGS

In order to more clearly illustrate the technical solution in the embodiment of the disclosure or the related art, the accompanying drawings needed in description of the embodiments or the related art are simply introduced below. It is apparent that the accompanying drawings in the following description are some embodiments of the disclosure, for the ordinary skill in the art, some other accompanying drawings can also be obtained according to these on the premise of not contributing creative effort.

DESCRIPTIONS ABOUT THE REFERENCE SIGNS

10—substrate; 11—array area; 12—peripheral area; 20—trench mask layer; 21—trench mask pattern; 211—first array trench mask pattern; 212—second array trench mask pattern; 213—first periphery trench mask pattern; 214—second periphery trench mask pattern; 30—trench; 31—first array trench; 32—second array trench; 33—first periphery trench; 34—second periphery trench; 40—WL; 41—first WL; 411—first WL protrusion; 42—second WL; 421—second WL protrusion; 43—first dielectric layer; 44—WL metal layer; 45—second dielectric layer; 46—an interlayer dielectric layer; 40a—blank WL; 50—contact structure; 51—contact opening; 52—contact metal layer; 60—active area; 70—bit line; and 80—connection metal layer.

DETAILED DESCRIPTION

Figure 1:
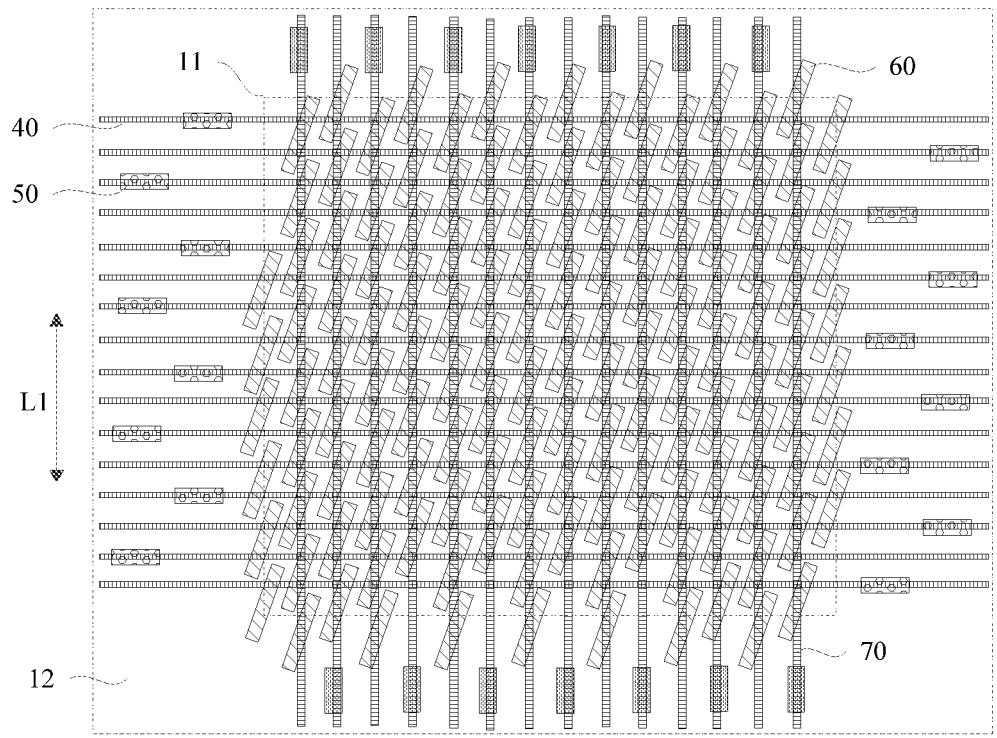
FIG. 1 is a structure diagram of a WL and a bit line in a semiconductor structure in the related art.
Figure 2:
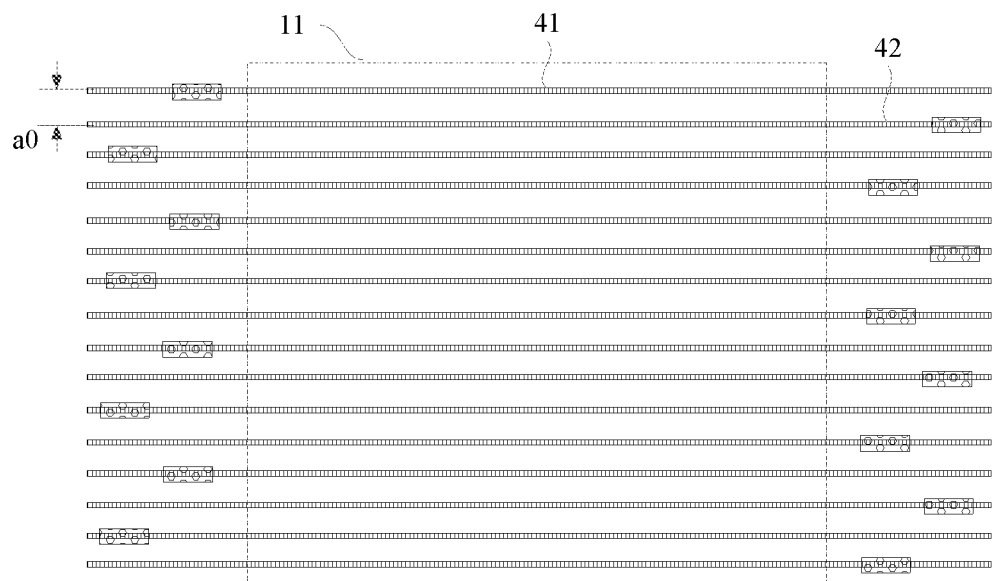
FIG. 2 is a structure diagram of a WL and a contact structure in a semiconductor structure in the related art.

The inventor of the disclosure finds in the actual research process that the present DRAM includes multiple repeating memory units, each of which usually includes a capacitor and a transistor. A grid electrode of the transistor is coupled to a WL, a drain electrode is coupled to a bit line, and a source electrode is coupled to the capacitor. A voltage signal on the WL may control the transistor to be on or off, and then data information stored in the capacitor is read through the bit line, or the data information is written into the capacitor through the bit line for storage. The WL is coupled to a WL driver through a LICON located in a periphery area of the memory unit, so that it is convenient for the WL driver to input the voltage signal to the WL. FIG. 1 is a structure diagram of a WL and a bit line in a semiconductor structure in the related art. FIG. 2 is a structure diagram of a WL and a contact structure in a semiconductor structure in the related art. With reference to FIG. 1 and FIG. 2, the present semiconductor memory is generally provided with a substrate. The substrate is provided with a WL 40 and a bit line 70 in turn. The WL 40 and the bit line 70 are staggered, and the WL 40 may be arranged at intervals along a first direction L1 in FIG. 1.

An active area 60 arranged in an array is provided on the substrate. The active area 60 forms an array area 11, that is, the area inside the dotted line in the figure. A peripheral area 12 is formed around the array area 11. The active area 60 is coupled to the WL 40 and the bit line 70, respectively. A contact structure 50 is usually arranged on the WL 40 in the peripheral area 12, so that the WL 40 is electrically coupled to the WL driver. A first WL 41 and a second WL 42 in the present WL 40 are arranged alternately and at intervals along the first direction. The part of the first WL 41 and the second WL 42 in the active area 60 and the part of them in the peripheral area 12 have the same width. The spacing between the adjacent WLs 40 (that is, the spacing between the first WL 41 and the second WL 42) is a0 illustrated in FIG. 2. As the feature size of a DRAM device continues to decrease, the spacing between the adjacent WLs 40 decreases, that is, a0 decreases, which will reduce the space around the WL 40, and the demand for the alignment accuracy of a contact opening 51 and the WL 40 increases accordingly during the setting of the contact structure 50, which increases the difficulty of setting the contact structure 50. In addition, a contact area between the contact structure 50 and the WL is small due to the small width of the WL in the peripheral area 12, such that the contact resistance at the joint of the contact structure 50 and the WL increases accordingly, which makes the joint of the contact structure 50 and the WL prone to circuit break and short circuit. Furthermore, even if the contact structure 50 is set on the WL, the problem of signal interference easily occurs due to the too small spacing between the adjacent contact structures 50, thus affecting the storage performance of the semiconductor memory.

In view of this, in the semiconductor structure manufacturing method provided by embodiments of the disclosure, by forming multiple mutually independent trenches in the substrate, in the process of forming the trench, the structure density of the first area is different from that of the second area, such that the feature size of the trench formed in the first area is different from that of the trench in the second area, and then by adjusting process conditions, it can be guaranteed that the feature size of the WL in the first area is different from that of the WL in the second area when the WL is formed in the trench. That is, the feature size of the WL in the peripheral area is greater than that of the WL in the array area, and the contact structure is provided on the WL of the peripheral area with the greater feature size, thereby reducing the difficulty of setting the contract structure on the WL of the peripheral area, and increasing the contract area between the WL and the contact structure to improve the stability of connection between them and reduce the contact resistance at the joint of them, so as to ensure that the contact structure can stably connect the WL and the WL driver to reduce the short circuit and circuit break between them and improve the stability of signal transmission between them. In this way, the performance of the semiconductor structure is ensured.

In order to make the purpose, technical solutions and advantages of the disclosure clearer, the technical solutions in the embodiments of the disclosure will be described below in more detail in combination with the accompanying drawings in preferred embodiments of the disclosure. In the accompanying drawings, the same or similar reference signs throughout represent the same or similar parts or the parts with the same or similar function. The described embodiments are a part of the embodiments of the disclosure but not all. The embodiments described below by reference to the accompanying drawings are exemplary, and they are intended to explain the disclosure and are not understood as a limit to the disclosure. All other embodiments obtained by those of ordinary skill in the art based on the embodiments in the disclosure without creative work shall fall within the range of protection of the disclosure. The embodiments of the disclosure are elaborated below in combination with the accompanying drawings.

Figure 3:
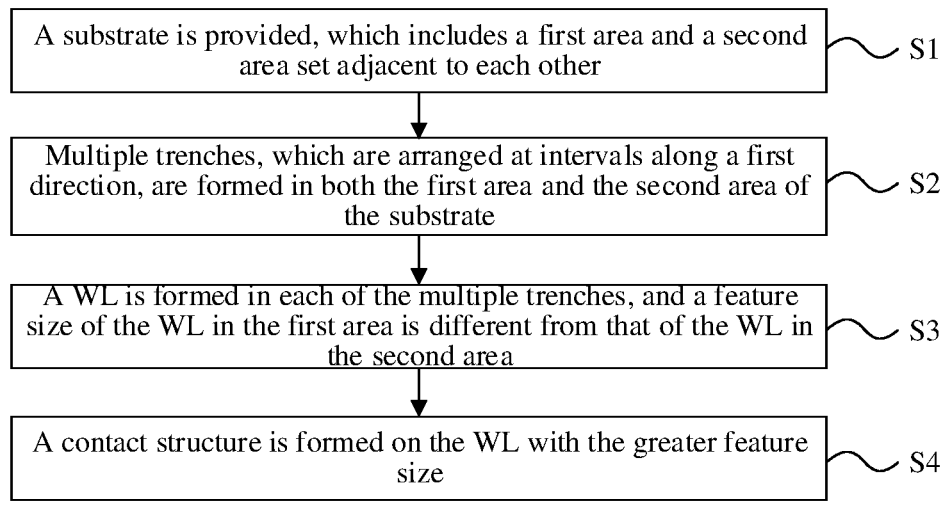
FIG. 3 is a flowchart of a semiconductor structure manufacturing method provided by an embodiment of the disclosure.
Figure 4:
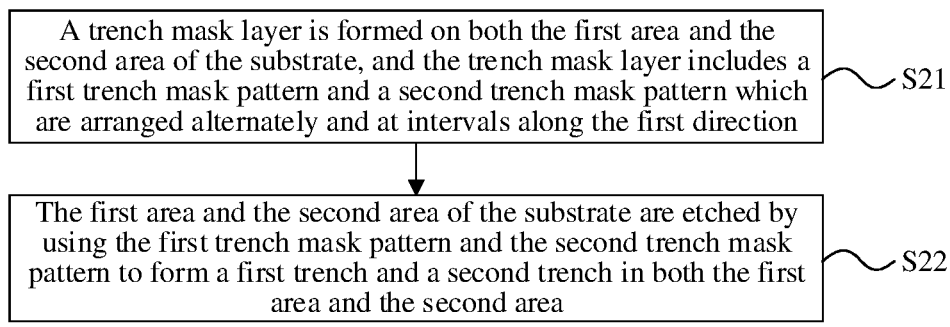
FIG. 4 is a flowchart of forming a trench in a semiconductor structure manufacturing method provided by an embodiment of the disclosure.
Figure 5:
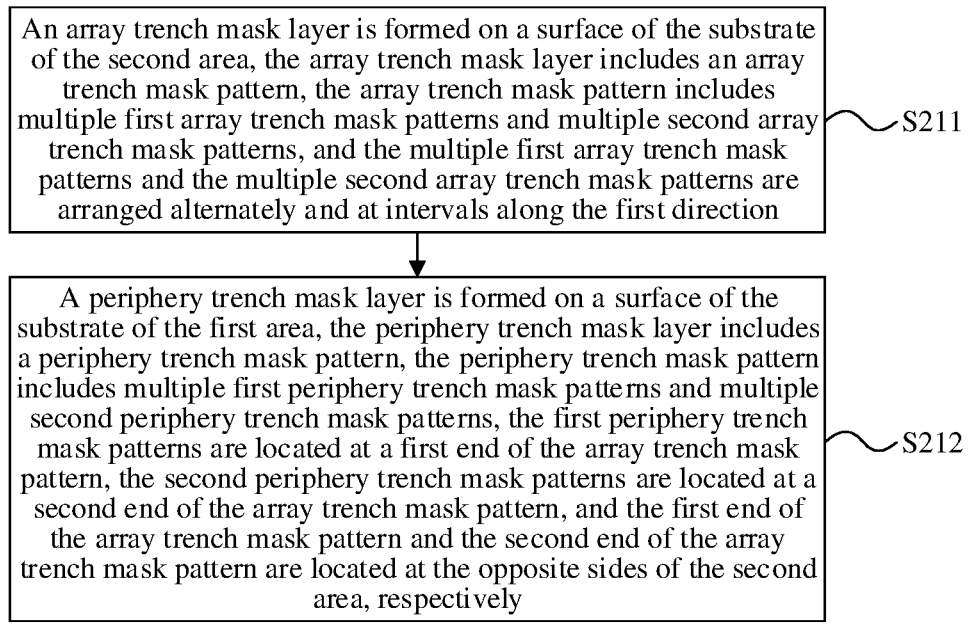
FIG. 5 is a flowchart of forming a trench mask layer in a semiconductor structure manufacturing method provided by an embodiment of the disclosure.
Figure 6:
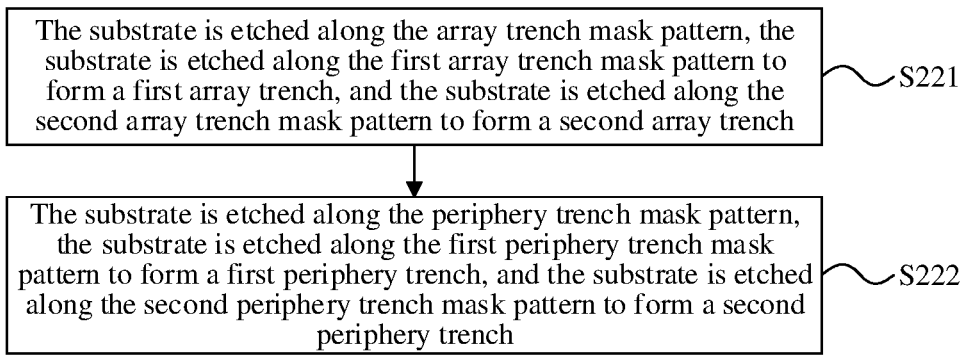
FIG. 6 is a flowchart of etching a substrate along a trench mask layer in a semiconductor structure manufacturing method provided by an embodiment of the disclosure.
Figure 7:
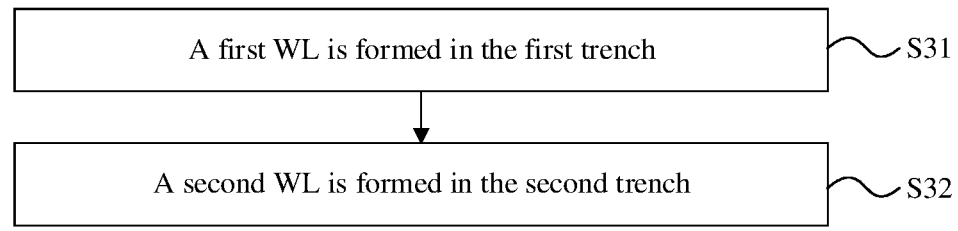
FIG. 7 is a flowchart of forming a WL in a trench in a semiconductor structure manufacturing method provided by an embodiment of the disclosure.
Figure 8:
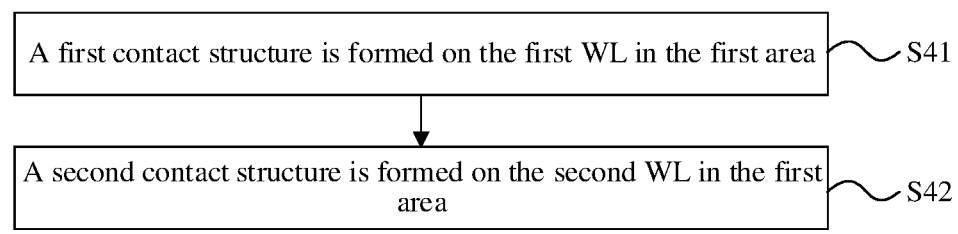
FIG. 8 is a flowchart of forming a contact structure in a WL of the periphery area in a semiconductor structure manufacturing method provided by an embodiment of the disclosure.
Figure 9:
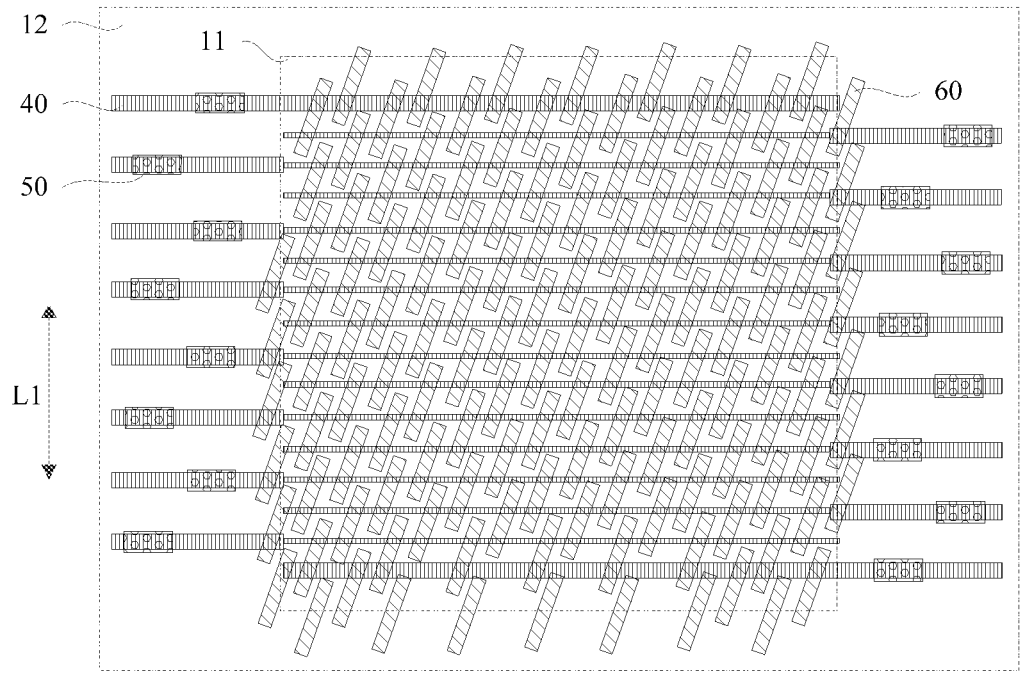
FIG. 9 is a structure diagram of a semiconductor structure provided by an embodiment of the disclosure.
Figure 10:
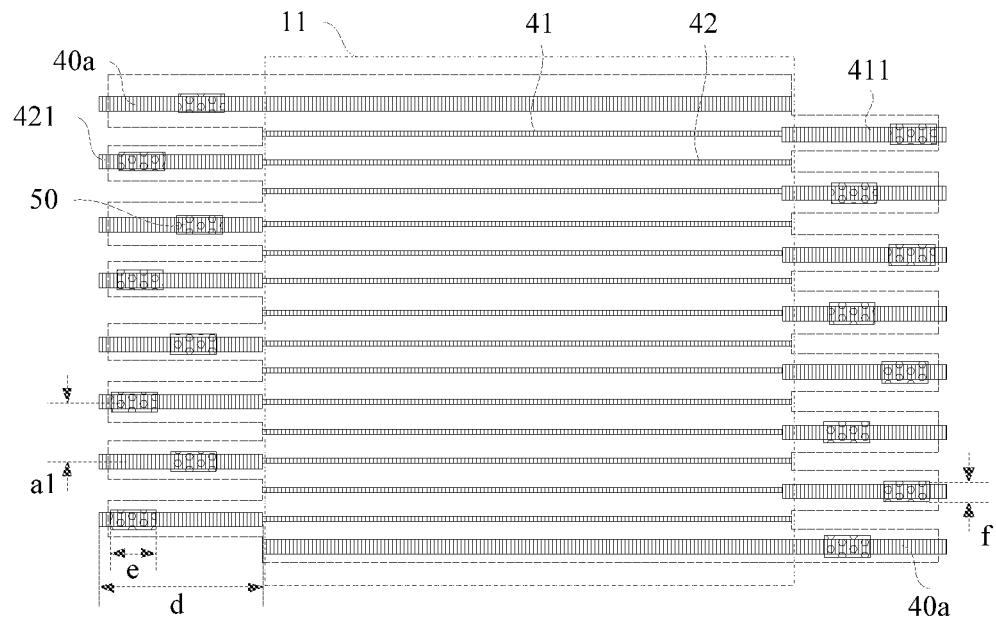
FIG. 10 is a structure diagram of a WL of a semiconductor structure provided by an embodiment of the disclosure.
Figure 11:
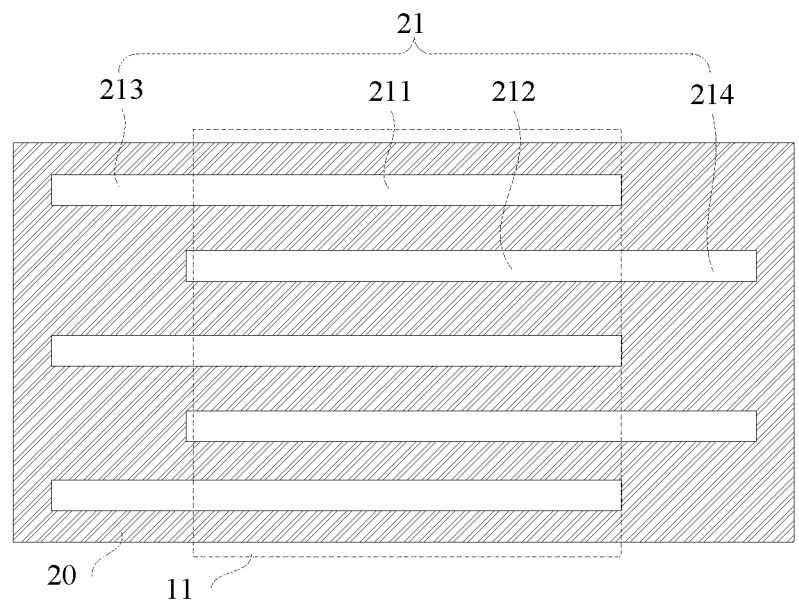
FIG. 11 is a structure diagram of a trench mask layer of a semiconductor structure provided by an embodiment of the disclosure.
Figure 12:
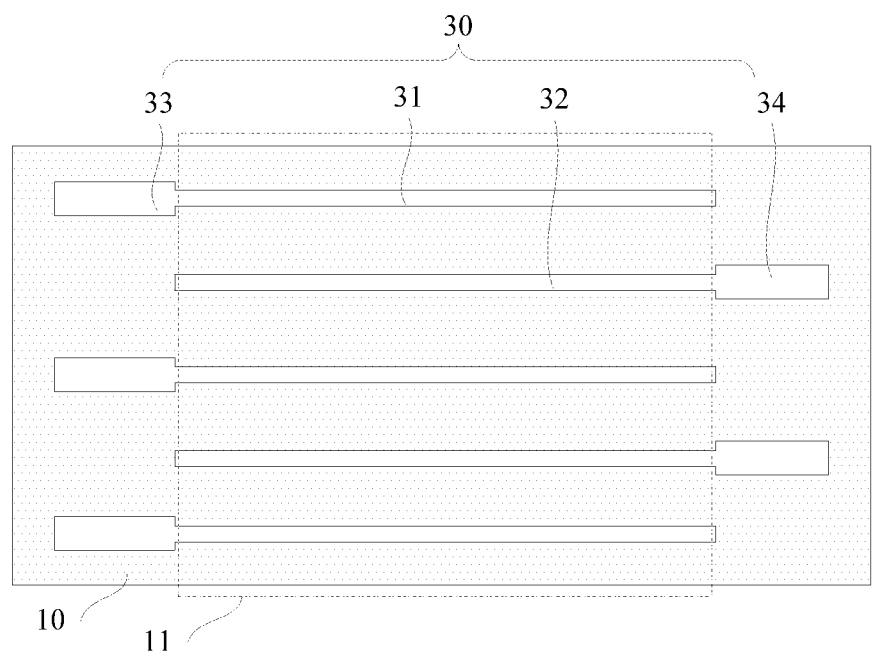
FIG. 12 is a structure diagram of forming a trench on a substrate of a semiconductor structure provided by an embodiment of the disclosure.
Figure 13:
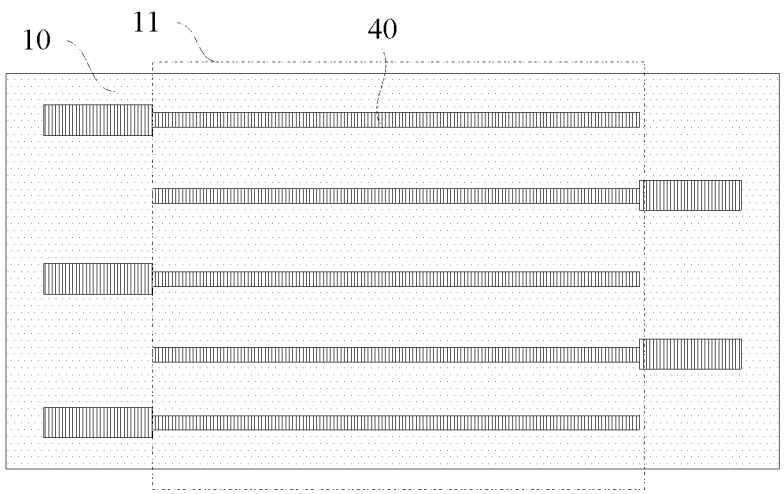
FIG. 13 is a structure diagram of forming a WL in a trench of a semiconductor structure provided by an embodiment of the disclosure.
Figure 14:
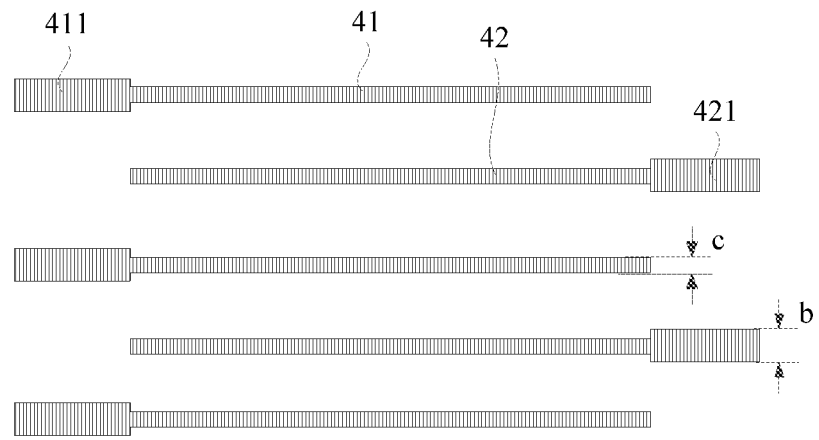
FIG. 14 is a structure diagram of a WL in a trench of a semiconductor structure provided by an embodiment of the disclosure.
Figure 15:
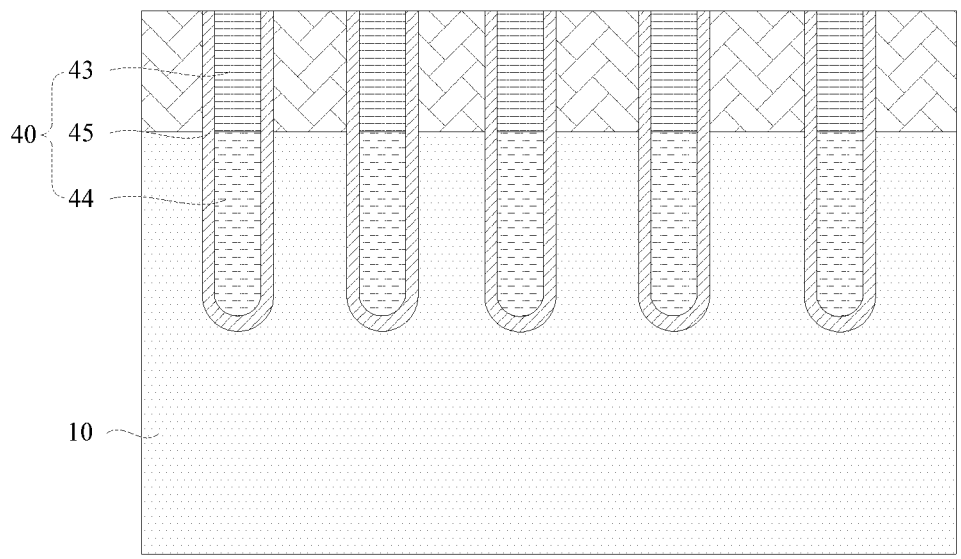
FIG. 15 is a sectional view in a first sectioning direction of a semiconductor structure provided by an embodiment of the disclosure.
Figure 16:
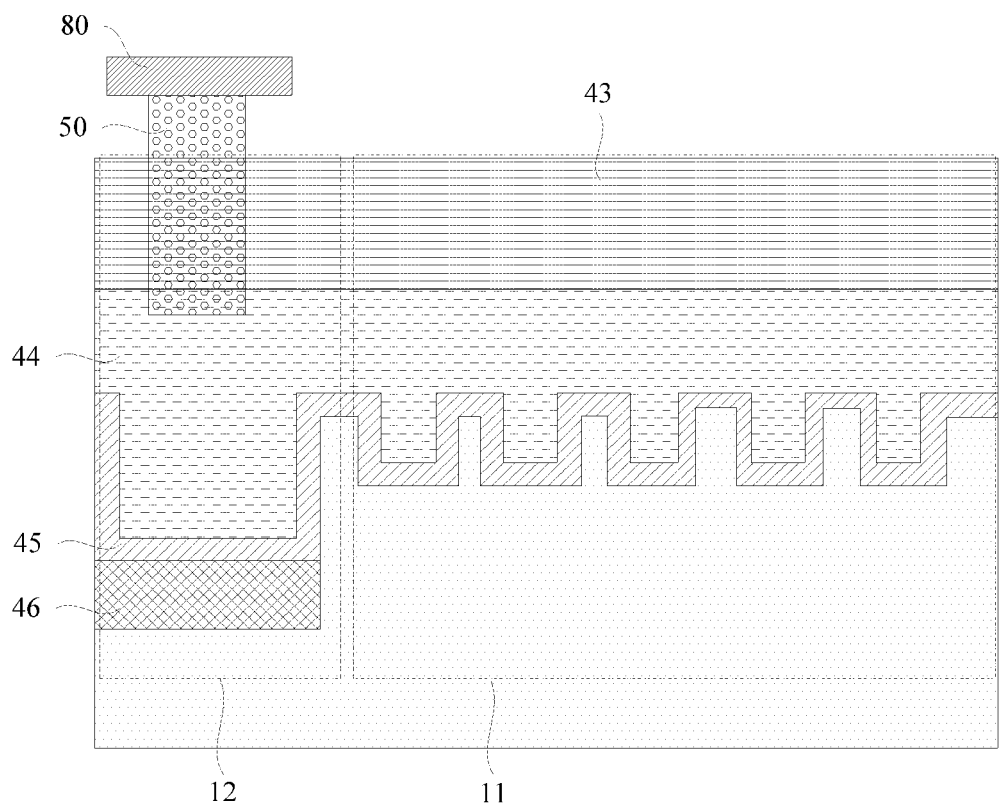
FIG. 16 is a sectional view of a second sectioning direction of a semiconductor structure provided by an embodiment of the disclosure.
Figure 17:
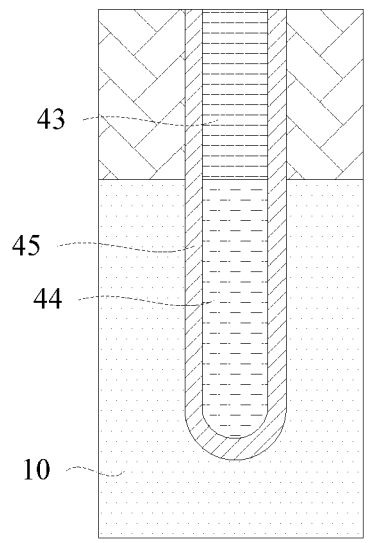
FIG. 17 is a structure diagram of a single WL in a periphery area of a semiconductor structure provided by an embodiment of the disclosure.
Figure 18:
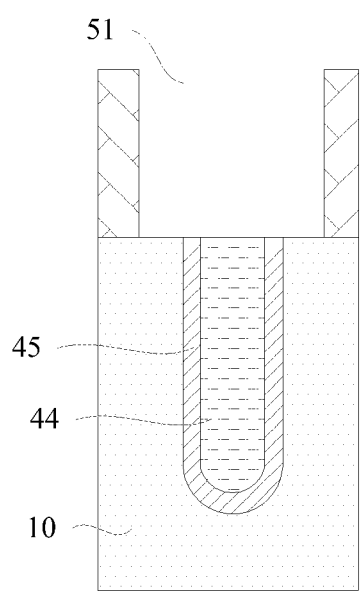
FIG. 18 is a structure diagram of forming a contact opening on a WL in a periphery area of a semiconductor structure provided by an embodiment of the disclosure.
Figure 19:
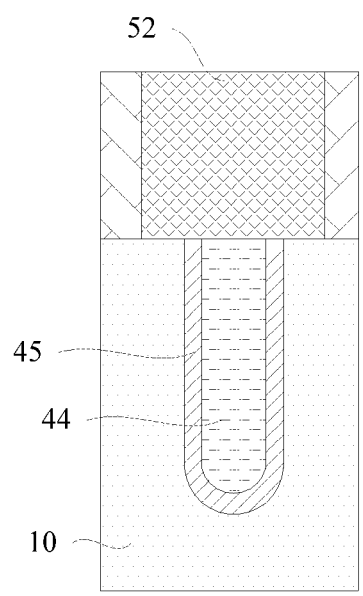
FIG. 19 is a structure diagram of forming a contact structure on a WL in a periphery area of a semiconductor structure provided by an embodiment of the disclosure.

FIG. 3 is a flowchart of a semiconductor structure manufacturing method provided by an embodiment of the disclosure. FIG. 4 is a flowchart of forming a trench in a semiconductor structure manufacturing method provided by an embodiment of the disclosure. FIG. 5 is a flowchart of forming a trench mask layer in a semiconductor structure manufacturing method provided by an embodiment of the disclosure. FIG. 6 is a flowchart of etching a substrate along a trench mask layer in a semiconductor structure manufacturing method provided by an embodiment of the disclosure. FIG. 7 is a flowchart of forming a WL in a trench in a semiconductor structure manufacturing method provided by an embodiment of the disclosure. FIG. 8 is a flowchart of forming a contact structure in a WL of the periphery area in a semiconductor structure manufacturing method provided by an embodiment of the disclosure. FIG. 9 is a structure diagram of a semiconductor structure provided by an embodiment of the disclosure. FIG. 10 is a structure diagram of a WL of a semiconductor structure provided by an embodiment of the disclosure. FIG. 11 is a structure diagram of a trench mask layer of a semiconductor structure provided by an embodiment of the disclosure. FIG. 12 is a structure diagram of forming a trench on a substrate of a semiconductor structure provided by an embodiment of the disclosure. FIG. 13 is a structure diagram of forming a WL in a trench of a semiconductor structure provided by an embodiment of the disclosure. FIG. 14 is a structure diagram of a WL in a trench of a semiconductor structure provided by an embodiment of the disclosure. FIG. 15 is a sectional view in a first sectioning direction of a semiconductor structure provided by an embodiment of the disclosure. FIG. 16 is a sectional view of a second sectioning direction of a semiconductor structure provided by an embodiment of the disclosure. FIG. 17 is a structure diagram of a single WL in a periphery area of a semiconductor structure provided by an embodiment of the disclosure. FIG. 18 is a structure diagram of forming a contact opening on a WL in a periphery area of a semiconductor structure provided by an embodiment of the disclosure. FIG. 19 is a structure diagram of forming a contact structure on a WL in a periphery area of a semiconductor structure provided by an embodiment of the disclosure.

First Embodiment

Referring to FIG. 3 to FIG. 8 in combination with FIG. 9 to FIG. 19, an embodiment of the disclosure provides a semiconductor structure manufacturing method. As illustrated in FIG. 3, the method includes the following operations.

At S1, a substrate is provided, which includes a first area and a second area set adjacent to each other.

At S2, multiple trenches, which are arranged at intervals along a first direction, are formed in both the first area and the second area of the substrate.

At S3, a WL is formed in each of the multiple trenches, and a feature size of the WL in the first area is different from that of the WL in the second area.

At S4, a contact structure is formed on the WL with the greater feature size.

In the semiconductor structure manufacturing method above, by forming multiple mutually independent trenches in the substrate, in the process of forming the trench, the structure density of the first area is different from that of the second area, such that the feature size of the trench formed in the first area is different from that of the trench in the second area, and then it can be guaranteed that the feature size of the WL in the first area is different from that of the WL in the second area when the WL is formed in the trench. The contact structure is set on the WL with the greater feature size, which reduces the difficulty of setting the contact structure on the WL, and increases the contact area between the WL and the contact structure to improve the stability of connection between them and reduce the contact resistance at the joint of them, so as to ensure that the contact structure can stably connect the WL and a WL driver. The spacing between adjacent WLs in the area, where the contact structure is located, is larger, such that the width of the contact structure can be appropriately increased, and short circuit between the contact structure and the adjacent WL can be avoided, so as to improve the stability of signal transmission between them and then ensure the performance of the semiconductor structure.

It is to be noted that the semiconductor structure provided in the present embodiment may generally be a semiconductor memory, and multiple active areas 60 arranged in an array are provided on the substrate 10 of the semiconductor structure. The area where the multiple active areas 60 forms an array area 11. The position where the active area 60 is not set at the periphery area of the array area 11 forms a peripheral area 12, and the peripheral area 12 surrounds the periphery area of the array area 11. Multiple embedded WLs 40 are provided on the substrate 10. The first area, may correspond to the peripheral area 12, and the second area may correspond to the array area 11. The first area and the second area may be adjacently set side by side or in parallel, or the first area may be around the periphery area of the second area, which is not limited here.

The formation of the WL 40 may be achieved through operations S2 and S3. At S2, multiple trenches 30 independent of each other are formed on the substrate 10, and the trench 30 sinks into the substrate 10. In the process of forming the trench 30, based on a pattern density loading effect, the feature size of the trench 30 in the peripheral area 12 will be greater than that of the trench 30 in the array area 11. Based on the size of the trench 30, at S3, the WL 40 formed in the trench 30 will be distributed along the shape of the trench 30, such that the feature size of the WL 40 in the peripheral area 12 is greater than that of the WL 40 in the array area 11.

At S4, the contact structure 50 is formed in the WL 40 in the peripheral area 12, such that the contact area between the contact structure 50 and the WL 40 will increase as the feature size of the WL 40 in the peripheral area 12 increases. In this way, the stability of connection between the contact structure 50 and the WL 40 in the peripheral area 12 is increased, and the contact resistance at the joint of them is reduced, so as to ensure that the contact structure 50 may stably connect the WL 40 and the WL driver, and then improve the stability of signal transmission between them. Furthermore, when the contact structure 50 is provided in the peripheral area 12, referring to the related art illustrated in FIG. 1, the spacing between the adjacent WLs 40 in the peripheral area is smaller/less, and the arrangement density of the WL 40 is greater. According to the structure illustrated in FIG. 3 of the disclosure, the spacing between the adjacent WLs 40 in the peripheral area 12 is greater, and the arrangement density of the WL 40 in the peripheral area 12 is smaller. In this way, the short circuit between the contact structure 50 and the adjacent WL 40 may be reduced, thereby ensuring the performance of the semiconductor structure.

Referring to FIG. 4, at S2, namely the operation of forming multiple trenches, which are arranged at intervals along the first direction, in both the first area and the second area of the substrate, includes as follows.

At S21, a trench mask layer is formed on both the first area and the second area of the substrate, and the trench mask layer includes a first trench mask pattern and a second trench mask pattern which are arranged alternately and at intervals along the first direction.

At S22, the first area and the second area of the substrate are etched by using the first trench mask pattern and the second trench mask pattern to form a first trench and a second trench in both the first area and the second area.

An etching rate of etching the first area of the substrate is greater than that of etching the second area of the substrate.

Setting like this can ensure the formation of trenches of different feature sizes, so as to form the WL in the trench.

It is to be noted that when the trench 30 is formed, a trench mask layer 20 may be made first, and the substrate 10 is etched along a trench mask pattern 21 of the trench mask layer 20, thereby forming the trench 30 on the substrate 10. An etching method selected in the etching process may be dry etching or wet etching, for example, plasma etching, laser etching, chemical liquid etching, and the like, which is not limited by the present embodiment. The first direction may be the direction illustrated in FIG. 9. Etching gases in the etching process are sulfur fluoride, chlorine, difluoromethane, nitrogen and helium. Setting like this can achieve the purpose of controlling the etching rate in the etching process and improving the controllability of the etching process by adjusting and controlling etching process parameters. The above gases may physically impact and chemically react with the substrate respectively, thus achieving the etching of the substrate. The type or ratio of the gas used in multiple steps of the etching process may be different. The purpose of controlling the etching rate is achieved by adjusting and controlling the flow and velocity of the etching gas, thereby improving the controllability of the etching process.

The first trench mask pattern includes a first mask protrusion relative to the second trench mask pattern. The second trench mask pattern includes a second mask protrusion relative to the first trench mask pattern. Both the first mask protrusion and the second mask protrusion are located in the first area and located at the opposite sides of the second area. Setting like this can form the first trench and the second trench in the first area, respectively.

To form the first mask protrusion and the second mask protrusion, referring to FIG. 5 in combination with FIG. 11, at S21, namely the operation of forming the trench mask layer on both the first area and the second area of the substrate, and the trench mask layer includes the first trench mask pattern and the second trench mask pattern which are arranged alternately and at intervals along the first direction, includes as follows.

At S211, an array trench mask layer is formed on a surface of the substrate of the second area, the array trench mask layer includes an array trench mask pattern, the array trench mask pattern includes multiple first array trench mask patterns and multiple second array trench mask patterns, and the multiple first array trench mask patterns and the multiple second array trench mask patterns are arranged alternately and at intervals along the first direction.

At S212, a periphery trench mask layer is formed on a surface of the substrate of the first area, the periphery trench mask layer includes a periphery trench mask pattern, the periphery trench mask pattern includes multiple first periphery trench mask patterns and multiple second periphery trench mask patterns, the first periphery trench mask patterns are located at a first end of the array trench mask pattern, the second periphery trench mask patterns are located at a second end of the array trench mask pattern, and the first end of the array trench mask pattern and the second end of the array trench mask pattern are located at the opposite sides of the second area, respectively.

It is to be noted that the structure of trench mask layer 20 may refer to FIG. 11. The trench mask pattern 21 is formed on the trench mask layer 20. In the present embodiment, the trench mask pattern 21 is divided into the array trench mask pattern located in the array area 11 and the periphery trench mask pattern located in the periphery area 12. The array trench mask pattern located in the array area 11 may include multiple first array trench mask patterns 211 and multiple second array trench mask patterns 212. Multiple array trench mask patterns 21 are arranged at intervals along the first direction. There is spacing between the adjacent array trench mask patterns 21, and the spacing may be adjusted according to the spacing between the finally formed adjacent WLs 40, which is not limited by the present embodiment. The first array trench mask patterns 211 may be the trench mask pattern arranged in an odd-numbered row, correspondingly, the second array trench mask patterns 212 may be the trench mask pattern arranged in an even-numbered row, and those patterns are arranged alternately and at intervals.

Similar to the array trench mask pattern, the periphery trench mask pattern located in the periphery area 12 may include multiple first periphery trench mask patterns 213 and multiple second periphery trench mask patterns 214, and the multiple periphery trench mask patterns are arranged at intervals along the first direction. The first periphery trench mask patterns 213 and the second periphery trench mask patterns 214 are at the opposite sides of the array area 11, respectively, the first periphery trench mask patterns 213 at the same side are arranged at intervals, and the second periphery trench mask patterns 214 at the same side are arranged at intervals.

The first periphery trench mask pattern 213 is coupled to an end of the first array trench mask pattern 211 in the odd-numbered row to form the first trench mask pattern. The second periphery trench mask pattern 214 is coupled to an end of the second array trench mask pattern 212 in the even-numbered row to form the second trench mask pattern. The first periphery trench mask pattern 213 forms the first mask protrusion in the first trench mask pattern, and the second periphery trench mask pattern 214 forms the second mask protrusion in the second trench mask pattern.

The first trench mask pattern includes the same feature size in the first area and the second area of the substrate 10. The second trench mask pattern includes the same feature size in the first area and the second area of the substrate 10. Setting like this can reduce the difficulty of preparing the trench mask layer. It is to be noted that the above limit is that the feature size of the first array trench mask pattern 211 is equivalent to the feature size of the first periphery trench mask pattern 213, and the feature size of the second array trench mask pattern 212 is equivalent to the feature size of the second periphery trench mask pattern 214.

In practical use, a method for manufacturing the trench mask layer 20 may use self-aligned double patterning (SADP) or self-aligned quadruple pattern (SAQP), which is not limited by the present embodiment. The feature sizes of the first array trench mask pattern 211 and the first periphery trench mask pattern 213 in the first trench mask pattern, as well as the feature sizes of the second array trench mask pattern 212 and the second periphery trench mask pattern 214 in the second array trench mask pattern 212 may be determined by using a spacer in the etching process, such that the above limit may reduce the difficulty of setting the spacer and help to reduce the feature size. Of course, the method for manufacturing the trench mask layer 20 may also use photolithography. The feature sizes of the first trench mask pattern and the second trench mask pattern may be limited by adjusting the size of a photo mask. The above limit may also reduce the difficulty of manufacturing the photo mask and reduce the processing difficulty of optical proximity correction (OPC).

Furthermore, referring to FIG. 6 in combination with FIG. 12, at S22, namely the operation of etching the substrate along the trench mask pattern, includes as follows.

At S221, the substrate is etched along the array trench mask pattern, the substrate is etched along the first array trench mask pattern to form a first array trench, and the substrate is etched along the second array trench mask pattern to form a second array trench.

At S222, the substrate is etched along the periphery trench mask pattern, the substrate is etched along the first periphery trench mask pattern to form a first periphery trench, and the substrate is etched along the second periphery trench mask pattern to form a second periphery trench.

The etching rate of etching the substrate 10 along the periphery trench mask pattern is greater than the etching rate of etching the substrate 10 along the array trench mask pattern.

It is to be noted that the structure of the trench 30 formed after etching may be illustrated in FIG. 12, there is the structure with the active area 60 in the array area 11, such that the structure density of the array area 11 is higher than that of the periphery area 12. According to the pattern density loading effect, in the etching process, the etching rate is low in the area with high pattern density, and the etching rate is high in the area with low pattern density. Therefore, the etching rate of the substrate 10 in the periphery trench mask pattern is high, while the etching rate of the substrate 10 in the array trench mask pattern is low, and the feature sizes of the first periphery trench 33 and the second periphery trench 34 finally formed are greater than those of the first array trench 31 and the second array trench 32.

The etching rate is the etching rate of the substrate 10 in the first direction, that is, the etching rate in the direction of trench width. The feature size of the first trench in the first area is greater than that of the first trench in the second area, and the feature size of the second trench in the first area is greater than that of the second trench in the second area. Setting like this can form the WL with the greater feature size in the first area, and form the WL with a less/smaller feature size in the second area. The first periphery trench 33 and the second periphery trench 34 form the first trench in the first area, and the first array trench 31 and the second array trench 32 form the second trench in the second area. That is, the etching rates of the first array trench 31 and the second array trench 32 in the array area 11 are lower than those of the first periphery trench 33 and the second periphery trench 34 in the periphery area 12.

The feature size of the trench 30 may include the depth and width of the trench 30.

In the present embodiment, the pattern density loading effect may be enhanced by controlling the parameters of the etching process. The parameters may be adjusted and controlled in, but not limited to, the following ways: adjusting etching power and magnetic field intensity; adjust etching gas composition; controlling the generation of etching by-products; adjusting the uniformity of etching between the array area and the periphery area; controlling the ratio of chemical etching to physical etching; and controlling the steps of multi-step etching.

Based on this, referring to FIG. 7 in combination with FIG. 13 to FIG. 14, at S3, namely the operation of forming the WL in the trench, includes as follows.

At S31, a first WL is formed in the first trench.

At S32, a second WL is formed in the second trench.

The first WL and the second WL are arranged alternately and at intervals along the first direction.

Setting like this can form the first WL and the second WL, which are arranged alternately and at intervals to form a WL structure in the first area and the second area.

It is to be noted that the WL 40 may be formed in the trench 30 by deposition. As the trench 30 has the above feature size, the shape and size of the WL 40 are limited by the trench 30. The WL 40 may include a first WL 41 and a second WL 42. The first WL 41 and the second WL 42 are arranged alternately and at intervals. The first WL 41 may be in the odd-numbered row, and the second WL 42 may be in the even-numbered row. The first WL 41 may include a first WL protrusion 411 in the periphery area 12, the second WL 42 may include a second WL protrusion 421 in the periphery area 12, and the first WL protrusion 411 and the second WL protrusion 421 are located at the opposite sides of the array area 11, respectively. The feature size of the first WL protrusion 411 is greater than that of the first WL 41 in the array area 11, and the feature size of the second WL protrusion 421 is greater than that of the second WL 42 in the array area 11. The feature size of the WL 40 may include the thickness and width of the WL 40.

At the same time, as illustrated in FIG. 10, there is an interval size a1 between adjacent first WL protrusions 411, and the interval size between adjacent second WL protrusions 421 may also be a1. The interval size a1 is greater than the interval size a0 between the adjacent first WL 41 and second WL 42 in the related in FIG. 2.

As illustrated in FIG. 15, the WL 40 may include a second dielectric layer 45 formed in the trench 30, a WL metal layer 44 formed on a surface of the second dielectric layer 45, and a first dielectric layer 43 formed on a surface of the WL metal layer 44. As illustrated in FIG. 16, there is an interlayer dielectric layer 46 arranged between the second dielectric layer 45 of the WL 40 and the substrate 10, so as to prevent the process of forming the WL 40 from affecting the structure of the active area 60 of the substrate 10. The WL metal layer 44 may be tungsten, the first dielectric layer 43 may be a silicon nitride layer, and the second dielectric layer 45 may be a silicon dioxide layer.

The structure of the WL 40 includes the first WL 41 and the second WL 42. The feature size of the first WL protrusion 411 is greater than that of the first WL 41 in the array area, and the feature size of the second WL protrusion 421 is greater than that of the second WL 42 in the array area. The first WL protrusion 411 of the first WL 41 may be distributed in the odd-numbered row of the WL 40, and the second WL protrusion 421 of the second WL 42 may be distributed in the even-numbered row of the WL 40. Therefore, compared with the structure of the WL 40 in FIG. 1 in the related art, the structure of the WL 40 in the present embodiment has the following structural characteristics and advantages.

1) The spacing between the adjacent first WL protrusion 411 and second WL protrusion 421 is greater. The spacing may be the part shown by a1 in FIG. 10. Compared with the spacing a0 between the WLs 40 illustrated in FIG. 1 in the related art, the spacing a1 in the present embodiment is the spacing after the WL 40 in an alternate row (that is, the odd-numbered row or the even-numbered row) is removed, such that the spacing a1 is greater than the spacing a0. Setting like this can ensure that there is more space between the adjacent WLs 40 in the periphery area 12, so as to facilitate the later setting of the contact structure 50.

2) The feature size of the WL 40 in the periphery area 12 is greater. The feature size may include the width and thickness of the WL 40, and the width of the WL 40 in the periphery area 12 may be the part shown by b in FIG. 14. Setting like this can ensure that the contact area between the contact structure 50 and the WL 40 in the periphery area 12 is greater, thereby reducing the difficulty of electrical connection between them, and improving the stability of connection and signal transmission.

Furthermore, referring to FIG. 8 in combination with FIG. 16 to FIG. 19, at S4, namely the operation of forming the contact structure on the WL with the greater feature size, includes as follows.

At S41, a first contact structure is formed on the first WL in the first area.

At S42, a second contact structure is formed on the second WL in the first area.

The first contact structure and the second contact structure are located at the opposite sides of the second area, respectively.

Setting like this reduces the difficulty of setting the first contact structure and the second contact structure in the first area and reduce the contact resistance between the contact structure and the WL due to the larger/greater feature size of the WL in the first area.

The above step may be understood as forming a contact opening on the WL in the periphery area. The contact opening exposes the WL metal layer of the WL. The contact opening is filled with a contact metal layer. The contact metal layer abuts against the WL metal layer, and the contact metal layer forms the contact structure. Specifically, the first contact structure may be formed on the first WL protrusion 411, and the second contact structure may be formed on the second WL protrusion 421.

It is to be noted that the contact structure 50 is located on the WL 40 in the periphery area 12, as the feature size of the WL 40 in the periphery area 12 is increased, the difficulty of setting the contact opening 51 in the periphery area 12 will be reduced, and the contact opening 51 will expose more WL metal layer 44. Therefore, after the contact metal layer 52 is deposited, the contact area between the contact metal layer 52 and the WL metal layer 44 increases, thus improving the stability of electrical connection between them and realizing the signal transmission between them. It is to be noted that the contact structure 50 is coupled to the WL driver through a connection metal layer 80, and the connection metal layer 80 is arranged in the periphery area 12 of the substrate 10.

There are multiple first WL protrusions 411 and multiple second WL protrusions 421. Each of the first WL protrusions 411 and the second WL protrusions 421 is provided with the contact structure 50. As illustrated in FIG. 9, as the spacing between the adjacent WLs 40 in the periphery area 12 of the present embodiment is increased compared with that in the related art, the spacing between the contact structures 50 on the adjacent WLs 40 in the periphery area 12 is increased accordingly. In order to further ensure that the spacing between the adjacent contact structures 50 is increased, in the present embodiment, the contact structures 50 on the first WL protrusion 411 are staggered along the first direction, and the contact structures 50 on the second WL protrusions 421 are staggered along the first direction.

It is to be noted that staggered arrangement means that when two adjacent contact structures 50 are projected along the first direction, their projections do not overlap completely, there is no overlapped part at all, thereby minimizing the degree of signal interference between the adjacent contact structures 50.

Second Embodiment

As illustrated in FIG. 9 to FIG. 19, based on the first embodiment, the second embodiment of the disclosure provides a semiconductor structure.

Specifically, the semiconductor structure includes a substrate 10 and multiple WLs 40 arranged on the substrate 10. The multiple WLs 40 are arranged at intervals along the first direction. The substrate 10 includes a first area and a second area which are arranged adjacently. The first area may be a periphery area 12, and the second area may be an array area 11. The above adjacent arrangement may be understood as that the peripheral area 12 may surround the periphery area of the array area 11, or they may be arranged in parallel or side by side. The WL 40 is located in the first area and the second area, and a feature size of the WL 40 in the first area is different from a feature size of the WL 40 in the second area. The contact structure is located on the WL with the greater feature size.

In the semiconductor structure above, by forming in the substrate multiple WLs which are arranged at intervals along the first direction, the feature size of the WL in the first area being different from that of the WL in the second area, and setting the contact structure on the WL with the greater feature size, the difficulty of setting the contact structure on the WL may be reduced, and the contact area between the WL and the contact structure is increased to improve the stability of connection between them and reduce the contact resistance at the joint of them, so as to ensure that the contact structure may stably connect the WL and the WL driver, reduce the problem of signal interference between the adjacent contact structures, and improve the stability of signal transmission between them. The spacing of the adjacent WLs in the area where the contact structure is located is larger, such that the short circuit between the WL and the WL driver can be reduced, and then the performance of the semiconductor structure is ensured.

The WLs 40 include a first WL 41 and a second WL 42. The first WL 41 and the second WL 42 are arranged alternately and at intervals. The first WL 41 includes a first WL protrusion 411 relative to the second WL 42, the second WL 42 includes a second WL protrusion 421 relative to the first WL 41. The first WL protrusion 411 and the second WL protrusion 421 are located at opposite sides of the second area, respectively, and both of them are located in the first area. Setting like this can facilitate the formation of the WL with the greater feature size in the first area and then facilitate the subsequent setting of the contact structure.

The feature size of the WL 40 in the first area is greater than that of the WL 40 in the second area. That is, the feature size of the first WL protrusion 411 is greater than that of the first WL 41 in the array area, and the feature size of the second WL protrusion 421 is greater than that of the second WL 42 in the array area. Setting like this can reduce the difficulty of setting the contact structure on the WL in the first area.

Furthermore, a contact structure 50 is arranged on the WL 40 with the greater feature size. The contact structure 50 includes a first contact structure located on the first WL 41 in the first area and a second contact structure located on the second WL 42 in the first area. That is, the first contact structure is located on the first WL protrusion 411, and the second contact structure is located on the second WL protrusion 421. Setting like this can increase the spacing between adjacent contact structures, thereby reducing the problem of signal interference.

It is to be noted that in the present embodiment, as illustrated in FIG. 9, the feature size of the WL 40 in the periphery area 12 is greater than that of the WL 40 in the array area 11, and the contact structure 50 is arranged on the WL 40 in the periphery area 12. In this way, the difficulty of setting the contact structure 50 on the WL 40 of the peripheral area 12 may be reduced, and the contract area between the WL 40 and the contact structure 50 is increased, which improves the stability of connection between them, and reduces the contact resistance at the joint of them, so as to ensure that the contact structure 50 may connect the WL 40 and the WL driver stably to improve the stability of signal transmission between them. The spacing of the adjacent WLs 40 in the periphery area 12 is increased, such that the short circuit between the WL 40 and the WL driver is reduced, and then the performance of the semiconductor structure is ensured.

As illustrated in FIG. 10, the first WL 41 and the second WL 42 form the WL 40 together. The first WL protrusion 411 is located on an end of one side, close to the periphery area 12, of the first WL 41, and the second WL protrusion 421 is located on an end of the other side, close to the periphery area 12, of the second WL 42. The first WL protrusion 411 and the second WL protrusion 421 are located at the opposite sides of the array area 11, respectively. The first WL protrusion 411 is located in the odd-numbered rows of the WL 40, that is, the first row, the third row, the fifth row, and the like, and is located on the end of one side of the first WL 41 in the odd-numbered row. The second WL protrusion 421 may be located in the even-numbered rows of the WL 40, that is, the second row, the fourth row, the sixth row, and the like, and is located on the end of the other side of the second WL 42 in the even-numbered row.

Specifically, the feature size of the WL 40 in the first area is smaller than 1.5 times that of the WL 40 in the second area. Setting like this can avoid the problem of short circuit between the adjacent WLs. Setting like this can also avoid the too large feature size of the WL 40 in the periphery area 12, avoid the decrease of the spacing between two adjacent WLs 40 in the periphery area 12, and prevent the problem of short circuit occurring when the spacing between the adjacent WLs 40 in the periphery area 12 is too small.

Furthermore, as illustrated in FIG. 10, the first contact structure is staggered along the first direction, and/or the second contact structure is staggered along the first direction. Setting like this can increase the spacing between adjacent contact structures, thereby reducing the problem of signal interference. There are multiple first contact structures located on the first WL protrusion 411, and there are multiple second contact structures located on the second WL protrusion 421. The multiple first contact structures and the multiple second contact structures are located at the opposite sides of the array area 11. The multiple first contact structures located at the same side of the array area 11 are staggered along the first direction, and the multiple second contact structures located at the same side of the array area 11 are staggered along the first direction. Setting like this can increase the spacing between the adjacent contact structures 50, thereby reducing the problem of signal interference.

The width of the first contact structure is not less than the width of the first WL in the first area, and the length of the first contact structure is not greater than the length of the first WL in the first area. And/or, the width of the second contact structure is not less than the width of the second WL in the first area, and the length of the second contact structure is not greater than the length of the second WL in the first area. Setting like this can ensure the electrical contact between a contact metal layer of the contact structure and a metal layer of the WL to realize the signal transmission between them, reduce the difficulty of setting the contact structure, reduce the contact resistance at the joint of the contact structure and the WL, and ensure the stability of connection between them.

It is to be noted that the above limit may be understood as that the width of the contact structure 50 is not less than the width of the WL 40 in the periphery area 12, that is, the width of the first contact structure is not less than the width of the first WL protrusion 411, and the width of the second contact structure is not less than the width of the second WL protrusion 421. The width of the contact structure 50 may be the part shown by f in FIG. 10. Appropriate increase of the width f of the contact structure 50 may reduce the difficulty of setting the contact structure 50 and the contact resistance at the joint of the contact structure 50 and the WL 42, thereby ensuring the stability of connection between them. Setting like this can ensure the stability of connection between the contact structure 50 and the WL 40 in the periphery area 12, thereby ensuring the stability of signal transmission of the WL 40. As an achievable implementation mode, the width range of the contact structure 50 is 10 nm to 80 nm.

As an achievable implementation mode, the width range of the WL 40 in the array area 11 is 6 nm to 30 nm, and the width of the WL 40 in the array area 11 may be the part shown by c in FIG. 14. The width range of the WL 40 in the periphery area 12 is 10 nm to 60 nm, and the width of the WL 40 in the periphery area 12 may be the part shown by b in FIG. 14.

As an achievable implementation mode, the length range of the WL 40 in the periphery area 12 is 90 nm to 350 nm, and the length of the WL 40 in the periphery area 12 may be the part shown by d in FIG. 10. The length of the contact structure 50 is not greater than the length of the WL 40 in the periphery area 12. The length range of the contact structure 50 is 90 nm to 350 nm, and the length of the contact structure 50 may be the part shown by e in FIG. 10.

Furthermore, in the present embodiment, two ends of the WL 40 along the first direction are respectively provided with a blank WL 40a. The blank WL 40a may be located at the most edge of multiple WLs 40. The blank WL 40a is not used for a writing or reading process of stored data, but is used for imitating a row structure of the WL 40 in the semiconductor memory. The blank WL 40a may usually be used for providing reference and tracking signals for a drive circuit of the semiconductor memory.

It is to be understood in the above description that the terms "install", "connected/coupled" and "connect" should be understood generally, unless otherwise expressly stated and qualified, for example, it may be a fixed connection, or an indirect connection through an intermediate medium, or it may be an internal connection of two components or an interaction relationship between two components. For those of ordinary skill in the art, specific meanings of these terms in the disclosure may be understood according to a specific condition. Orientation or position relationships indicated by terms "upper", "lower", "front", "back", "vertical", "horizontal", "top", "bottom", "inner", "outer" and the like are orientation or position relationships illustrated in the accompanying drawings, are adopted not to indicate or imply that indicated devices or components must be in specific orientations or structured and operated in specific orientations but only to conveniently describe the disclosure and simplify descriptions. In the description of the disclosure, "multiple" means two or more than two, unless otherwise specified precisely and specifically.

The specification and claims of the disclosure and terms "first", "second", "third", "fourth", and the like (if existing) in the foregoing drawings are used for distinguishing similar objects rather than describing a specific sequence or a precedence order. It should be understood that the objects may be exchanged under appropriate circumstances, so that the embodiments of the disclosure described here may, for example, be implemented in an order different from that described or shown here. In addition, terms "include" and "have" and any variations thereof are intended to cover non-exclusive inclusions. For example, it is not limited for processes, methods, systems, products or devices containing a series of steps or units to clearly list those steps or units, and other steps or units which are not clearly listed or are inherent to these processes, methods, products or devices may be included instead.

Finally, it is to be noted that the above embodiments are only used for illustrating, but not limiting, the technical solutions of the disclosure. Although the disclosure is elaborated referring to the above embodiments, those of ordinary skill in the art should understand that they may still modify the technical solutions in each above embodiment, or equivalently replace a part or all of technical features; but these modifications and replacements do not make the nature of the corresponding technical solutions depart from the scope of the technical solutions in each embodiment of the disclosure.

The invention claimed is:

1. A semiconductor structure manufacturing method, comprising:
    providing a substrate comprising a first area and a second area adjacent to each other;
    forming multiple trenches, which are arranged at intervals along a first direction, in both the first area and the second area of the substrate;
    forming a word line (WL) in each of the multiple trenches, a feature size of a portion of the WL in the first area being different from a feature size of a second portion of the WL in the second area; and
    forming a contact structure on the portion of the WL in the first area when the feature size of the portion of the WL in the first area is greater than the feature size of the second portion of the WL in the second area and forming the contact structure on the second portion of the WL in the second area when the feature size of the second portion of the WL in the second area is greater than the feature size of the portion of the WL in the first area.

2. The semiconductor structure manufacturing method of claim 1, wherein forming the multiple trenches, which are arranged at intervals along the first direction, in both the first area and the second area of the substrate comprises:
    forming a trench mask layer on both the first area and the second area of the substrate;
    wherein the trench mask layer comprises a first trench mask pattern and a second trench mask pattern which are arranged alternately and at intervals along the first direction; and
    etching the first area and the second area of the substrate by using the first trench mask pattern and the second trench mask pattern to form a first trench and a second trench in both the first area and the second area;
    wherein an etching rate of etching the first area of the substrate is greater than an etching rate of etching the second area of the substrate.

3. The semiconductor structure manufacturing method of claim 2, wherein the first trench mask pattern comprises a first mask protrusion relative to the second trench mask pattern;
    the second trench mask pattern comprises a second mask protrusion relative to the first trench mask pattern; and
    both the first mask protrusion and the second mask protrusion are located in the first area and located at opposite sides of the second area.

4. The semiconductor structure manufacturing method of claim 3, wherein the first trench mask pattern has a same feature size in the first area and the second area of the substrate; and
    the second trench mask pattern has a same feature size in the first area and the second area of the substrate.

5. The semiconductor structure manufacturing method of claim 4, wherein the etching rate is an etching rate of the substrate in the first direction;
    a feature size of a part of the first trench in the first area is greater than a feature size of a second part of the first trench in the second area; and
    a feature size of a part of the second trench in the first area is greater than a feature size of a second part of the second trench in the second area.

6. The semiconductor structure manufacturing method of claim 2, wherein forming the WL in each of the multiple trenches comprises:
    forming a first WL in the first trench; and
    forming a second WL in the second trench;
    wherein the first WL and the second WL are arranged alternately and at intervals along the first direction.

7. The semiconductor structure manufacturing method of claim 6, wherein forming the contact structure on the portion of the WL in the first area when the feature size of the portion of the WL in the first area is greater than the feature size of the second portion of the WL in the second area and forming the contact structure on the second portion of the WL in the second area when the feature size of the second portion of the WL in the second area is greater than the feature size of the portion of the WL in the first area comprises:
    forming a first contact structure on a portion of the first WL in the first area; and
    forming a second contact structure on a portion of the second WL in the first area;
    wherein the first contact structure and the second contact structure are located at opposite sides of the second area, respectively.

8. The semiconductor structure manufacturing method of claim 7, wherein the first contact structure is staggered along the first direction; or the second contact structure is staggered along the first direction; or the first contact structure is staggered along the first direction and the second contact structure is staggered along the first direction.

9. The semiconductor structure manufacturing method of claim 2, wherein etching gases in an etching process comprise sulfur fluoride, chlorine, difluoromethane, nitrogen and helium.

10. A semiconductor structure, comprising:
    a substrate comprising a first area and a second area set adjacent to each other;
    a word line (WL), which is located in the first area and the second area; wherein a feature size of a portion of the WL in the first area is different from a feature size of a second portion of the WL in the second area; and
    a contact structure, which is located on the portion of the WL in the first area when the feature size of the portion of the WL in the first area is greater than the feature size of the second portion of the WL in the second area and is located on the second portion of the WL in the second area when the feature size of the second portion of the WL in the second area is greater than the feature size of the portion of the WL in the first area.

11. The semiconductor structure of claim 10, wherein the feature size of the portion of the WL in the first area is greater than the feature size of the second portion of the WL in the second area.

12. The semiconductor structure of claim 11, wherein the feature size of the portion of the WL in the first area is less than 1.5 times the feature size of the second portion of the WL in the second area.

13. The semiconductor structure of claim 10, wherein the WL comprises a first WL and a second WL;
the first WL and the second WL are arranged alternately and at intervals along a first direction; and
the first WL comprises a first WL protrusion relative to the second WL, the second WL comprises a second WL protrusion relative to the first WL, the first WL protrusion and the second WL protrusion are located at opposite sides of the second area, respectively.

14. The semiconductor structure of claim 13, wherein the contact structure comprises a first contact structure on the first WL protrusion in the first area and a second contact structure on the second WL protrusion in the first area;
the first contact structure is staggered along the first direction; and
the second contact structure is staggered along the first direction.

15. The semiconductor structure of claim 14, wherein a width of the first contact structure is not less than a width of a portion of the first WL in the first area, and a length of the first contact structure is not greater than a length of the portion of the first WL in the first area; or
a width of the second contact structure is not less than a width of a portion of the second WL in the first area, and a length of the second contact structure is not greater than a length of the portion of the second WL in the first area; or
the width of the first contact structure is not less than the width of the portion of the first WL in the first area, and the length of the first contact structure is not greater than the length of the portion of the first WL in the first area; and the width of the second contact structure is not less than the width of the portion of the second WL in the first area, and the length of the second contact structure is not greater than the length of the portion of the second WL in the first area.

16. The semiconductor structure of claim 15, wherein a feature size range of at least one of the first WL or the second WL in the second area is 6 nm to 30 nm, a feature size range of at least one of the portion of the first WL or the portion of the second WL in the first area is 10 nm to 60 nm, and a feature size range of at least one of the first contact structure or the second contact structure is 10 nm to 80 nm.

* * * * *